US006493366B1

(12) United States Patent
Johnson et al.

(10) Patent No.: US 6,493,366 B1
(45) Date of Patent: Dec. 10, 2002

(54) VERTICAL CAVITY SURFACE EMITTING LASER WITH OXIDIZED STRAIN-COMPENSATED SUPERLATTICE OF GROUP III-V SEMICONDUCTOR

(75) Inventors: Frederick G. Johnson, Lanham, MD (US); Bikash Koley, College Park, MD (US); Linda M. Wasiczko, College Park, MD (US)

(73) Assignee: The United States of America as represented by the National Security Agency, Washington, DC (US)

( * ) Notice: Subject to any disclaimer, the term of this patent is extended or adjusted under 35 U.S.C. 154(b) by 0 days.

(21) Appl. No.: 09/564,371

(22) Filed: May 2, 2000

Related U.S. Application Data

(60) Provisional application No. 60/132,596, filed on May 5, 1999.

(51) Int. Cl.[7] .............................. H01S 5/00; H01S 3/08
(52) U.S. Cl. ......................... 372/45; 372/96; 372/102
(58) Field of Search ........................... 372/43–45, 96, 372/102

(56) References Cited

U.S. PATENT DOCUMENTS

| | | | |
|---|---|---|---|
| 5,262,360 A | 11/1993 | Holonyak et al. | |
| 5,373,522 A | 12/1994 | Holonyak et al. | |
| 5,567,980 A | 10/1996 | Holonyak et al. | |
| 5,696,023 A | 12/1997 | Holonyak et al. | |
| 5,719,891 A | * 2/1998 | Jewell et al. | 372/45 |
| 5,719,895 A | * 2/1998 | Jewell et al. | 372/45 |

OTHER PUBLICATIONS

J. Faist et al., "Characterization of GaAs/(GaAs)n(AlAs)m surface–emitting laser structures through reflectivity and high–resolution electron microscopy measurements", Journal of Applied Physics, vol. 66, No. 3, Aug. 1989, pp. 1023–1032.*

Russell D. Dupuis, "III–V Compound Semiconductor Native Oxides–The Newest of the Semiconductor Device Materials", Compound Semiconductor Jan./Feb. 1997, USA pp. 32–34.

(List continued on next page.)

*Primary Examiner*—Paul Ip
*Assistant Examiner*—James Menefee
(74) *Attorney, Agent, or Firm*—Robert D. Morelli

(57) ABSTRACT

A vertical cavity surface emitting laser that includes a Group III-V semiconductor material substrate; a first Distributed Bragg Reflector mirror, where the first Distributed Bragg Reflector mirror includes at least seven pairs of layers, where each layer has a different index of refraction, where one of the layers is a Group III-V semiconductor material, and where the other layer is a completely oxidized at least one strain-compensated superlattice of Group III-V semiconductor material, where each at least one strain-compensated superlattice includes at least two monolayers of a Group III-V semiconductor material and at least two monolayers of an aluminum-bearing Group III-V semiconductor material; a first Group III-V semiconductor material layer; a first contact; a selectively oxidized at least one strain-compensated superlattice of Group III-V semiconductor material, where each at least one strain-compensated superlattice of Group III-V semiconductor material includes at least two monolayers of a Group III-V semiconductor material and at least two monolayers of an aluminum-bearing Group III-V semiconductor material; a second Group III-V semiconductor material layer; a second contact; and a second Distributed Bragg Reflector mirror that is identical to the first Distributed Bragg Reflector mirror.

14 Claims, 2 Drawing Sheets

OTHER PUBLICATIONS

J. M. Dallesasse et al., "Hydrolyzation Oxidation of $Al_xGa_{1-x}A_sALA_sV$ Quantum Well Heterostructures and Superlattices", Appl. Phys. Lett. vol. 57, No. 26, Dec. 24, 1990, Amer Inst. of Phys., USA pp. 2844–2846.

H. Gebretsadik et al., "Lateral Oxidation of Inalas in Inp–Based Hetero–Structures For Long Wavelength Vertical Cavity Surface Emitting Laser Applications," Appl. Phys. Lett., vol. 72, No. 2, Jan. 12, 1998, USA, Amer. Inst. Phys. pp. 135–137.

P. Legay et al., "Oxide Confining Layer on an Inp Substrate", Journal of Applied Physics, vol. 85, No. 4, Feb. 15, 1999, USA, Amer. Inst. of Phys. pp. 2428–2430.

\* cited by examiner

VERTICAL CAVITY SURFACE EMITTING LASER WITH OXIDIZED STRAIN-COMPENSATED SUPERLATTICE OF GROUP III-V SEMICONDUCTOR

This application claims the benefit of U.S. Provisional Application No. 60/132,596, filed May 5, 1999.

FIELD OF THE INVENTION

The present invention relates, in general, to a coherent light generator and to a particular current control structure.

BACKGROUND OF THE INVENTION

In an article entitled "III-V Compound Semiconductor Native Oxides—The Newest of the Semiconductor Device Materials," published in *Compound Semiconductor*, January 1997, Russell D. DuPuis chronicled the development of the semiconductor oxide. Mr. DuPuis points out that Carl Frosch, of Bell Telephone Laboratories, disclosed in 1955 that a silicon wafer could be oxidized by exposing it to high temperature (e.g., 1050 degrees Celsius) and water vapor (i.e., steam) in either oxygen or nitrogen to form a layer of silicon dioxide thereon. The oxide, or native oxide, exhibited sufficiently high insulating properties to be used as an insulator in electronic devices manufacture in silicon.

It was widely thought that an insulating oxide could not be grown on Group III-V semiconductor materials with insulating properties as good as silicon dioxide. In 1990, Nick Holonyak, Jr. et al. discovered that such an oxide could be made. The discovery was described in U.S. Pat. No. 5,262,360, entitled "AlGaAs NATIVE OXIDE"; U.S. Pat. No. 5,373,522, entitled "SEMICONDUCTOR DEVICES WITH NATIVE ALUMINUM OXIDE REGIONS"; U.S. Pat. No. 5,696,023, entitled "METHOD OF MAKING ALUMINUM GALLIUM ARSENIDE SEMICONDUCTOR DEVICE WITH NATIVE OXIDE LAYER"; and U.S. Pat. No. 5,567,980, entitled "NATIVE OXIDE OF AN ALUMINUM-BEARING GROUP III-V SEMICONDUCTOR." U.S. Pat. Nos. 5,262,360; 5,373,522; 5,696,023; and 5,567,980 are hereby incorporated by reference into the specification of the present invention. The discovery was also described in an article entitled "Hydrolyzation oxidation of $Al_xGa_{1-x}As$—AlAs—GaAs quantum well heterostructures and superlattices," by J. M. Dallesasse, N. Holonyak, Jr., A. R. Sugg, T. A. Richard, and N. El-Zein, published by the American Institute of Physics in *Appl. Phys. Lett.*, 57, Dec. 24, 1990, pp. 2844–2846. The discovery is, essentially, exposing an aluminum-bearing Group III-V semiconductor material to high temperature (e.g., 375 degrees Celsius) and water vapor in nitrogen until a user-definable portion of the aluminum-bearing Group III-V semiconductor material is oxidized. Partial oxidation is useful in an electronic device for confining current flow to a user-definable path. Complete oxidation is useful in an electronic device for forming an insulator or part of a mirror.

Other relevant prior art includes an article by H. Gebretsadik et al., entitled "Lateral oxidation of InAlAs in InP-based heterostructures for long wavelength vertical cavity surface emitting laser application," published by the American Institute of Physics in *Appl. Phys. Lett.*, Jan. 12, 1998, on pp. 135–137, and an article by P. Legay et al., entitled "Oxide confining layer on an InP substrate," published by the American Institute of Physics in the *Journal of Applied Physics*, Vol. 85, No. 4, Feb. 15, 1999. Each article discloses a method of oxidizing a particular Group III-V semiconductor material on an InP substrate.

Most of the prior art methods of forming an oxide in a Group III-V semiconductor material involve the wet thermal oxidation of an $Al_xGa_{(1-x)}As$ layer because such methods are repeatable and are very controllable. However, such oxidation methods are limited to high aluminum content Group III-V semiconductor materials such as $Al_xGa_{(1-x)}As$ lattice matched to GaAs. Lattices are matched to avoid introducing any strain in the resulting structure which might reduce the reliability of the structure. Devices based on such materials are too slow and at the wrong wavelength for use in a fiber optic communication system. However, devices based on Group III-V semiconductor materials lattice matched to Indium Phosphide (InP) are fast enough and at the correct wavelength (i.e., 1.2 um to 1.6 um) for use in a fiber optic communication system. Unfortunately, the only high aluminum containing Group III-V semiconductor materials that are lattice matched to InP are $AlAs_xSb_{(1-x)}$ materials with an x value near 0.5. During the oxidation process, the metallic elements (e.g., As and Sb) separate and forms conductive interfacial layers which lead to increased strain in the oxidized structure. The strain may reduce the reliability of the structure.

There is no x value for which $Al_xGa_{(1-x)}As$ is lattice matched to InP. $Al_yIn_{(1-y)}As$ materials are more suitable but are only lattice matched to InP for y values near 0.48, which is a relatively low aluminum content for oxidation purposes. Therefore, present oxidation methods are not easily transferred to devices based on InP substrates. The maximum aluminum composition of an arsenide-based ternary material that is lattice matched to InP is $Al_{0.48}In_{0.52}As$. Because of the relatively small aluminum content, the oxidation rate in this material is very slow (~1 um/hour at 500 degrees Celsius).

SUMMARY OF THE INVENTION

It is an object of the present invention to form a vertical cavity surface emitting (VCSEL) laser using reflective mirrors, where each reflecting mirror includes a Group III-V semiconductor material on a totally oxidized at least one strain-compensated superlattice of Group III-V semiconductor material that does not require lattice matching to a Group III-V semiconductor material, and a selectively oxidized at least one strain-compensated superlattice of Group III-V semiconductor material.

It is another object of the present invention to form a VCSEL using a totally and selectively oxidized at least one strain-compensated superlattices of Group III-V semiconductor material that were oxidized in a timely manner and are compatible with standard Group III-V semiconductor device production methods so that the devices made therewith are not degraded during the oxidation process.

The present invention is a VCSEL that includes a Group III-V semiconductor material substrate; a first Distributed Bragg Reflector mirror (DBR); a first Group III-V semiconductor material layer; a first contact; a selectively oxidized at least one strain-compensated superlattice of Group III-V semiconductor material; a second Group III-V semiconductor material layer; a second contact; and a second DBR as defined above.

The first DBR and the second DBR each includes at least seven pairs of layers, where each layer in a pair of layers has a different index of refraction, where one of the layers in a pair is a Group III-V semiconductor material, and where the other layer in a pair is a completely oxidized at least one strain-compensated superlattice of Group III-V semiconductor material, where each at least one strain-compensated superlattice includes at least two monolayers of a Group III-V semiconductor material and at least two monolayers of an aluminum-bearing Group III-V semiconductor material.

The selectively oxidized at least one strain-compensated superlattice of Group III-V semiconductor material includes at least two monolayers of a Group III-V semiconductor material and at least two monolayers of an aluminum-bearing Group III-V semiconductor material.

In the preferred embodiment, the Group III-V semiconductor material substrate is InP of any type (i.e., n-type or p-type); one of the layers in each of the at least seven pairs of layers in the first DBR and the second DBR is comprised of InP; the other layer in each of the at least seven pairs of layers in the first DBR and the second DBR is comprised of a completely oxidized at least one strain-compensated superlattice of InAs/AlAs, where each at least one superlattice of InAs/AlAs includes at least two monolayers of InAs and at least two monolayers of AlAs; the first Group III-V semiconductor material layer is n-type InP; the first contact is an n-type contact; the selectively oxidized at least one strain-compensated superlattice of Group III-V semiconductor material is a selectively oxidized at least one strain-compensated superlattice of InAs/AlAs, where each at least one superlattice of InAs/AlAs includes at least two monolayers of InAs and at least two monolayers of AlAs; the second Group III-V semiconductor material layer is p-type InP; and the second contact is a p-type contact.

DETAILED DESCRIPTION

The present invention is a VCSEL that includes completely and selectively oxidized at least one strain-compensated superlattices of Group III-V semiconductor material that is not required to be lattice matched to a Group III-V semiconductor material, is oxidized in a timely manner, and is compatible with standard Group III-V semiconductor device production methods so that the devices made therewith are not degraded during the oxidation process.

Figure 1:
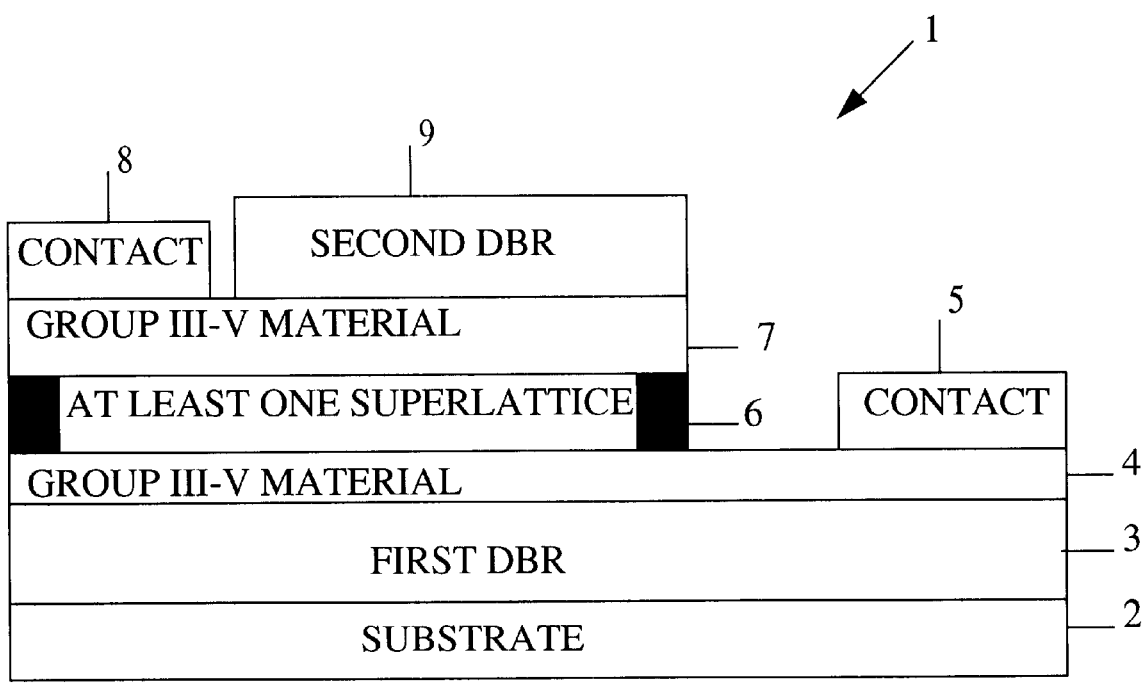
FIG. 1 is cross-sectional view of the present invention.

FIG. 1 is a cross-sectional view of the VCSEL 1 of the present invention. The VCSEL 1 includes a Group III-V semiconductor material substrate 2.

On the Group III-V semiconductor material substrate 2 is a first Distributed Bragg Reflector mirror (DBR) 3. The first DBR 3 includes at least seven pairs of layers, where each layer in a pair of layers has a different index of refraction, where one of the layers in a pair is a Group III-V semiconductor material, and where the other layer in a pair is a completely oxidized at least one strain-compensated superlattice of Group III-V semiconductor material, where each at least one strain-compensated superlattice includes at least two monolayers of a Group III-V semiconductor material and at least two monolayers of an aluminum-bearing Group III-V semiconductor material. The Group III-V material without aluminum and the Group III-V material with aluminum have lattice constants that are different from each other and, therefore, may be arranged to cancel out each other so that there is no strain in the resulting superlattice. If the Group III-V material without aluminum and the Group III-V material with aluminum have lattice constants that are exactly opposite from each other then the number of monolayers of the Group III-V semiconductor material that does not include aluminum will be the same as the number of monolayers of the aluminum-bearing Group III-V semiconductor material. However, if the Group III-V material without aluminum and the Group III-V material with aluminum have lattice constants that are not exactly opposite from each other then the number of monolayers of the Group III-V semiconductor material that does not include aluminum may be different from the number of monolayers of the aluminum-bearing Group III-V semiconductor material. That is, the number of monolayers of the Group III-V material without aluminum and the number of monolayers of the Group III-V material with aluminum are set so that there is no strain is in the resulting superlattice. To achieve this, the number of monolayers of the Group III-V material without aluminum may be different from the number of monolayers of the Group III-V material with aluminum. The definition of being completely oxidized is being oxidized along the entire length of the material in question. The VCSEL 1 of the present invention requires fewer pairs of layers in its DBR 3 than does the prior art VCSELs. Prior art VCSELs with an unoxidized semiconductor mirror requires at least thirty-five pairs of layers in their DBR whereas the present invention only requires seven.

On the first DBR 3 is a first Group III-V semiconductor material layer 4.

On the first Group III-V semiconductor material layer 4 is a first contact 5.

On the first contact 5 is a selectively oxidized at least one strain-compensated superlattice of Group III-V semiconductor material 6. The Group III-V material without aluminum and the Group III-V material with aluminum have lattice constants that are different from each other and, therefore, may be arranged to cancel out each other so that there is no strain in the resulting superlattice. If the Group III-V material without aluminum and the Group III-V material with aluminum have lattice constants that are exactly opposite from each other then the number of monolayers of the Group III-V semiconductor material that does not include aluminum will be the same as the number of monolayers of the aluminum-bearing Group III-V semiconductor material. However, if the Group III-V material without aluminum and the Group III-V material with aluminum have lattice constants that are not exactly opposite from each other then the number of monolayers of the Group III-V semiconductor material that does not include aluminum may be different from the number of monolayers of the aluminum-bearing Group III-V semiconductor material. That is, the number of monolayers of the Group III-V material without aluminum and the number of monolayers of the Group III-V material with aluminum are set so that there is no strain is in the resulting superlattice. To achieve this, the number of monolayers of the Group III-V material without aluminum may be different from the number of monolayers of the Group III-V material with aluminum. Being selectively oxidized is defined as being oxidized only along a portion of the length of the material in question. Selective oxidation is useful for controlling where current flows in a device. That is, current only flows where the material in question was not oxidized because an oxide is an insulator and does not carry current. In the preferred embodiment, selective oxidation occurs at both ends of the material in question and not in the middle of the material. However, any other suitable oxidation scheme is possible. Each at least one strain-compensated superlattice of Group III-V semiconductor material 6 includes at least two monolayers of a Group III-V semiconductor material and at least two monolayers of an aluminum-bearing Group III-V semiconductor material.

On the selectively oxidized at least one strain-compensated superlattice of Group III-V semiconductor material 6 is a second Group III-V semiconductor material layer 7.

On the second Group III-V semiconductor material layer 7 is a second contact 8.

On the second contact 8 is a second DBR 9. The second DBR 9 is identical to the first DBR 3.

Figure 2:
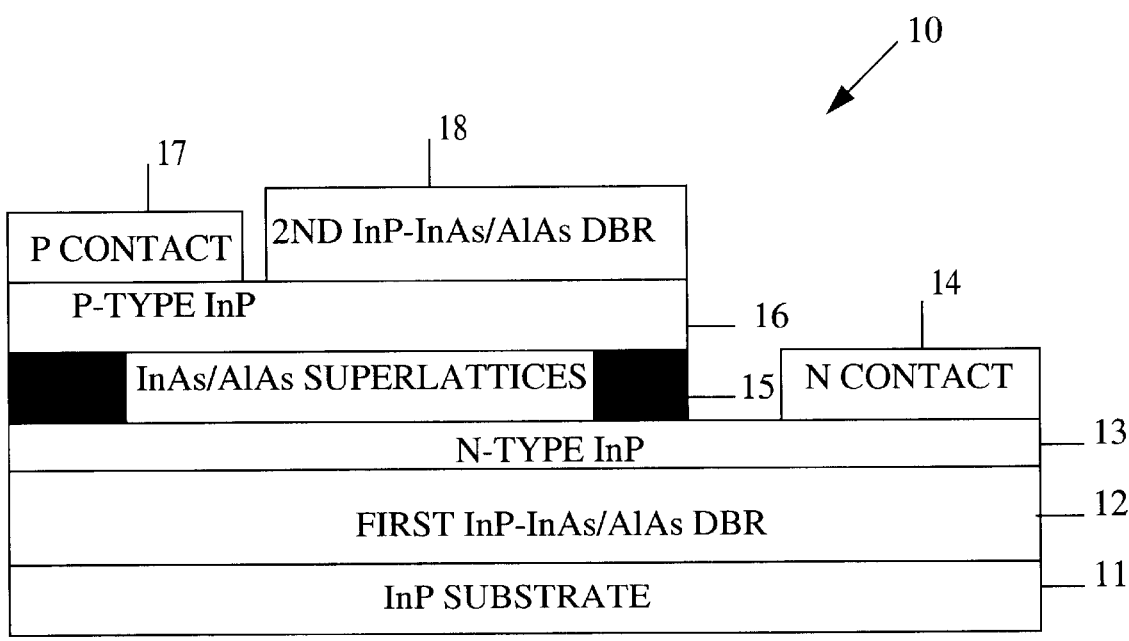
FIG. 2 is cross-sectional view of the preferred embodiment of the present invention.

FIG. 2 is a cross-sectional view of the preferred embodiment 10 of the VCSEL 1 of FIG. 1.

The preferred embodiment 10 of FIG. 2 includes an InP substrate 11 of any type (i.e n-type or p-type).

On the InP substrate 11 is a first DBR 12. The first DBR 12 includes at least seven pairs of layers, where one of the layers in a pair of layers is InP, and where the other layer in a pair of layers is a completely oxidized at least one strain-compensated superlattice of InAs/AlAs, and where each at least one superlattice of InAs/AlAs includes at least two monolayers of InAs and at least two monolayers of AlAs.

On the first DBR 12 is n-type InP 13.

On the n-type InP 13 is an n-type contact 14.

On the n-type contact 14 is a selectively oxidized at least one strain-compensated superlattice 15 of InAs/AlAs, where each at least one superlattice of InAs/AlAs includes at least two monolayers of InAs and at least two monolayers of AlAs.

On the selectively oxidized at least one strain-compensated superlattice 15 is p-type InP 16.

On the p-type InP 16 is a p-type contact 17.

On the p-type contact 17 is a second DBR 18. The second DBR 18 is identical to the first DBR 12.

What is claimed is:
1. A vertical cavity surface emitting laser, comprising:
 a) a Group III-V semiconductor material substrate;
 b) a first Distributed Bragg Reflector mirror on the Group III-V semiconductor material substrate, where the first Distributed Bragg Reflector mirror includes at least seven pairs of layers, where each layer in each of said at least seven pairs of layers has a different index of refraction, where one of the layers in each of said at least seven pairs of layers is a Group III-V semiconductor material, and where the other layer in each of said at least seven pairs of layers is a completely oxidized at least one strain-compensated superlattice of Group III-V semiconductor material, where each at least one strain-compensated superlattice includes at least two monolayers of a Group III-V semiconductor material and at least two monolayers of an aluminum-bearing Group III-V semiconductor material;
 c) a first Group III-V semiconductor material layer on the first Distributed Bragg Reflector mirror;
 d) a first contact on the first Group III-V semiconductor material layer;
 e) a selectively oxidized at least one strain-compensated superlattice of Group III-V semiconductor material on the first Group III-V semiconductor material layer, where each at least one strain-compensated superlattice of Group III-V semiconductor material includes at least two monolayers of a Group III-V semiconductor material and at least two monolayers of an aluminum-bearing Group III-V semiconductor material;
 f) a second Group III-V semiconductor material layer on the selectively oxidized at least one strain-compensated superlattice of Group III-V semiconductor material;
 g) a second contact on the second Group III-V semiconductor material layer; and
 h) a second Distributed Bragg Reflector mirror on the second Group III-V semiconductor material layer, where the first Distributed Bragg Reflector mirror includes at least seven pairs of layers, where each layer in each of said at least seven pairs of layers has a different index of refraction, where one of the layers in each of said at least seven pairs of layers is a Group III-V semiconductor material, and where the other layer in each of said at least seven pairs of layers is a completely oxidized at least one strain-compensated superlattice of Group III-V semiconductor material, where each at least one strain-compensated superlattice includes at least two monolayers of a Group III-V semiconductor material and at least two monolayers of an aluminum-bearing Group III-V semiconductor material.

2. The device of claim 1, wherein said Group III-V semiconductor material substrate is InP.

3. The device of claim 2, wherein one of the layers in each of said at least seven pairs of layers in the first Distributed Bragg Reflector mirror and the second Distributed Bragg reflector mirror is InP and where the other layer in each of said at least seven pairs of layers in the first Distribute Bragg Reflector mirror and the second Distributed Bragg Reflector mirror is completely oxidized at least one strain-compensated superlattice of InAs/AlAs, and where each at least one superlattice of InAs/AlAs includes at least two monolayers of InAs and at least two monolayers of AlAs.

4. The device of claim 3, wherein said first Group III-V semiconductor material layer is n-type InP.

5. The device of claim 4, wherein said first contact is an n-type contact.

6. The device of claim 5, wherein said selectively oxidized at least one strain-compensated superlattice of Group III-V semiconductor material is a selectively oxidized at least one strain-compensated superlattice of InAs/AlAs, where each at least one superlattice of InAs/AlAs includes at least two monolayers of InAs and at least two monolayers of AlAs.

7. The device of claim 6, wherein said second Group III-V semiconductor material layer is p-type InP.

8. The device of claim 7, wherein said second contact is a p-type contact.

9. The device of claim 1, wherein one of the layers in each of said at least seven pairs of layers in the first Distributed Bragg Reflector mirror and the second Distributed Bragg reflector mirror is InP and where the other layer in each of said at least seven pairs of layers in the first Distribute Bragg Reflector mirror and the second Distributed Bragg Reflector mirror is completely oxidized at least one strain-compensated superlattice of InAs/AlAs, and where each at least one superlattice of InAs/AlAs includes at least two monolayers of InAs and at least two monolayers of AlAs.

10. The device of claim 1, wherein said first Group III-V semiconductor material layer is n-type InP.

11. The device of claim 1, wherein said first contact is an n-type contact.

12. The device of claim 1, wherein said selectively oxidized at least one strain-compensated superlattice of Group III-V semiconductor material is a selectively oxidized at least one strain-compensated superlattice of InAs/AlAs, where each at least one superlattice of InAs/AlAs includes at least two monolayers of InAs and at least two monolayers of AlAs.

13. The device of claim 1, wherein said second Group III-V semiconductor material layer is p-type InP.

14. The device of claim 1, wherein said second contact is a p-type contact.

* * * * *